US011211904B1

(12) United States Patent
Gupta (10) Patent No.: US 11,211,904 B1
(45) Date of Patent: Dec. 28, 2021

(54) SWITCHED-CAPACITOR AMPLIFIER CIRCUIT

(71) Applicant: NXP B.V., Eindhoven (NL)

(72) Inventor: Sushil Kumar Gupta, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/917,604

(22) Filed: Jun. 30, 2020

(51) Int. Cl.
*H03F 1/02* (2006.01)
*H03M 1/38* (2006.01)
*H03F 3/00* (2006.01)
*H03F 3/45* (2006.01)

(52) U.S. Cl.
CPC ....... *H03F 3/005* (2013.01); *H03F 2200/129* (2013.01); *H03F 2200/156* (2013.01)

(58) Field of Classification Search
CPC ............... H03F 3/005; H03F 2200/129; H03F 2200/156; H03M 1/66; H03M 1/124; H03M 1/168
USPC ............................................. 330/9, 252–261
See application file for complete search history.

(56) References Cited

U.S. PATENT DOCUMENTS

| 7,633,423 | B2 * | 12/2009 | Cho | H03F 1/0205 |
| | | | | 341/155 |
| 8,390,372 | B2 | 3/2013 | Buter et al. | |
| 8,552,798 | B2 | 10/2013 | Leonardo | |
| 9,698,815 | B1 * | 7/2017 | Boulemnakher | H03M 1/66 |

* cited by examiner

*Primary Examiner* — Hieu P Nguyen (57) ABSTRACT

A switched-capacitor amplifier circuit includes multiple switched-capacitor networks, an amplifier, and multiple reset circuits. The switched-capacitor networks are configured to receive respective input voltages during a sampling phase, and generate sampled voltages. During an amplification phase, the amplifier is coupled with the switched-capacitor networks, and is configured to receive the sampled voltages. The amplifier is further configured to generate output voltages. During the sampling phase, the amplifier is coupled with the reset circuits, and is further configured to receive divided voltages such that the amplifier is reset. The reset circuits are configured to receive and provide a common-mode voltage and the output voltages to the amplifier. The divided voltages are generated based on the common-mode voltage and the output voltages. Each reset circuit includes at least one of a resistor and a capacitor.

20 Claims, 4 Drawing Sheets

SWITCHED-CAPACITOR AMPLIFIER CIRCUIT

BACKGROUND

The present disclosure relates generally to electronic circuits, and, more particularly, to a switched-capacitor amplifier circuit.

A switched-capacitor amplifier circuit is an electronic circuit that includes multiple switches, an amplifier, and a set of capacitors, and operates by charging and discharging the set of capacitors based on states (i.e., activated or deactivated states) of the switches. Such a switched-capacitor amplifier circuit operates in two phases, i.e., a sampling phase and an amplification phase. During the sampling phase, the set of capacitors receives and samples input voltages, and during the amplification phase, the amplifier outputs amplified versions of the sampled input voltages. Further, during the sampling phase, the amplifier is reset to prevent an introduction of an inter-modulation distortion in the outputs of the amplifier (i.e., the amplified versions of the sampled input voltages).

A conventional technique to reset the amplifier includes designing the amplifier with a significant bandwidth, and operating the amplifier in a unity-gain mode during the sampling phase. However, in such a scenario, the amplifier consumes a significant amount of power. An alternate technique to reset the amplifier includes shorting input and output terminals of the amplifier during the sampling phase. However, to implement the aforementioned technique for a multi-stage high-gain amplifier, an internal configuration (i.e., coupling and decoupling of internal components) of the amplifier is modified during the sampling phase. Such an amplifier requires additional recovery time to switch from the sampling phase to the amplification phase, thereby rendering the amplifier unsuitable for high-speed applications (e.g., a high-speed analog-to-digital converter having a sampling frequency greater than 250 mega samples per second). Thus, there is a need for a system that solves the aforementioned problems of conventional switched-capacitor amplifier circuits.

SUMMARY

In one embodiment, a switched-capacitor amplifier circuit is disclosed. The switched-capacitor amplifier circuit comprises first through fourth switched-capacitor networks, an amplifier, and first through fourth resistors. The first and third switched-capacitor networks are configured to receive a first input voltage during a sampling phase of the switched-capacitor amplifier circuit, and generate first and second sampled voltages, respectively. The second and fourth switched-capacitor networks are configured to receive a second input voltage during the sampling phase, and generate third and fourth sampled voltages, respectively. The amplifier is coupled with the first through fourth switched-capacitor networks during an amplification phase of the switched-capacitor amplifier circuit, and has first and second input terminals that are configured to receive fifth and sixth sampled voltages during the amplification phase, and first and second divided voltages during the sampling phase such that the amplifier is reset during the sampling phase, respectively. The amplifier further has first and second output terminals that are configured to generate first and second output voltages, respectively. The fifth sampled voltage is generated based on the first and second sampled voltages, and the sixth sampled voltage is generated based on the third and fourth sampled voltages. During the sampling phase, the first and second resistors are coupled with the first and second input terminals of the amplifier, and are configured to receive and provide a first common-mode voltage to the first and second input terminals of the amplifier, respectively. Further, during the sampling phase, the third resistor is coupled between the first input and first output terminals of the amplifier, and is configured to receive and provide the first output voltage to the first input terminal of the amplifier, and the fourth resistor is coupled between the second input and second output terminals of the amplifier, and is configured to receive and provide the second output voltage to the second input terminal of the amplifier. The first divided voltage is generated based on the first common-mode voltage and the first output voltage, and the second divided voltage is generated based on the first common-mode voltage and the second output voltage.

In another embodiment, a switched-capacitor amplifier circuit is disclosed. The switched-capacitor amplifier circuit comprises first through fourth switched-capacitor networks, an amplifier, and first through fourth reset circuits. The first and third switched-capacitor networks are configured to receive a first input voltage during a sampling phase of the switched-capacitor amplifier circuit, and generate first and second sampled voltages, respectively. The second and fourth switched-capacitor networks are configured to receive a second input voltage during the sampling phase, and generate third and fourth sampled voltages, respectively. The amplifier is coupled with the first through fourth switched-capacitor networks during an amplification phase of the switched-capacitor amplifier circuit, and has first and second input terminals that are configured to receive fifth and sixth sampled voltages during the amplification phase, and first and second divided voltages during the sampling phase such that the amplifier is reset during the sampling phase, respectively. The amplifier further has first and second output terminals that are configured to generate first and second output voltages, respectively. The fifth sampled voltage is generated based on the first and second sampled voltages, and the sixth sampled voltage is generated based on the third and fourth sampled voltages. During the sampling phase, the first and second reset circuits are coupled with the first and second input terminals of the amplifier, and are configured to receive and provide a first common-mode voltage to the first and second input terminals of the amplifier, respectively. Further, during the sampling phase the third reset circuit is coupled between the first input and first output terminals of the amplifier, and is configured to receive and provide the first output voltage to the first input terminal of the amplifier, and the fourth reset circuit is coupled between the second input and second output terminals of the amplifier, and is configured to receive and provide the second output voltage to the second input terminal of the amplifier. The first divided voltage is generated based on the first common-mode voltage and the first output voltage, and the second divided voltage is generated based on the first common-mode voltage and the second output voltage.

In some examples, the switched-capacitor amplifier circuit comprises first and second switches. The first switch is coupled with the first and third switched-capacitor networks and the first input terminal of the amplifier, and is configured to receive an amplification clock signal and the fifth sampled voltage, and provide the fifth sampled voltage to the first input terminal of the amplifier when the amplification clock signal is activated. The amplification clock signal is activated during the amplification phase. The first switch is coupled with the first and third switched-capacitor networks at a first node. The second switch is coupled with the second and fourth switched-capacitor networks and the second input terminal of the amplifier, and is configured to receive the amplification clock signal and the sixth sampled voltage, and provide the sixth sampled voltage to the second input terminal of the amplifier when the amplification clock signal is activated. The second switch is coupled with the second and fourth switched-capacitor networks at a second node.

In some examples, the switched-capacitor amplifier circuit comprises third and fourth switches. The third switch is coupled with the first switch at the first node, and is configured to receive a second common-mode voltage and an early-sampling clock signal, and provide the second common-mode voltage at the first node when the early-sampling clock signal is activated. The fifth sampled voltage is further generated based on the second common-mode voltage. The fourth switch is coupled with the second switch at the second node, and is configured to receive the second common-mode voltage and the early-sampling clock signal, and provide the second common-mode voltage at the second node when the early-sampling clock signal is activated. The sixth sampled voltage is further generated based on the second common-mode voltage.

In some examples, the switched-capacitor amplifier circuit comprises fifth through eighth switches. The fifth and sixth switches are coupled with the first and second resistors, respectively, and are configured to receive a sampling clock signal and the first common-mode voltage, and provide the first common-mode voltage to the first and second resistors when the sampling clock signal is activated, respectively. The sampling clock signal is activated during the sampling phase. The seventh switch is coupled between the third resistor and the first output terminal of the amplifier, and is configured to receive the sampling clock signal and the first output voltage, and provide the first output voltage to the third resistor when the sampling clock signal is activated. The first divided voltage is further generated based on a voltage drop across the first and third resistors. The eighth switch is coupled between the fourth resistor and the second output terminal of the amplifier, and is configured to receive the sampling clock signal and the second output voltage, and provide the second output voltage to the fourth resistor when the sampling clock signal is activated. The second divided voltage is further generated based on a voltage drop across the second and fourth resistors.

In some examples, the first switched-capacitor network includes ninth and tenth switches and a first capacitor network. The ninth switch is configured to receive the first input voltage and a sampling clock signal, and output the first input voltage when the sampling clock signal is activated. The sampling clock signal is activated during the sampling phase. The tenth switch is configured to receive a first reference voltage and an amplification clock signal, and output the first reference voltage when the amplification clock signal is activated. The amplification clock signal is activated during the amplification phase. The first capacitor is coupled with the ninth and tenth switches, and is configured to receive the first input voltage during the sampling phase, and the first reference voltage during the amplification phase, and charge up to the first sampled voltage based on the first input voltage during the sampling phase and the first reference voltage during the amplification phase.

In some examples, the second switched-capacitor network comprises eleventh and twelfth switches and a second capacitor. The eleventh switch is configured to receive the second input voltage and a sampling clock signal, and output the second input voltage when the sampling clock signal is activated. The sampling clock signal is activated during the sampling phase. The twelfth switch is configured to receive a second reference voltage and an amplification clock signal, and output the second reference voltage when the amplification clock signal is activated. The amplification clock signal is activated during the amplification phase. The second capacitor is coupled with the eleventh and twelfth switches, and is configured to receive the second input voltage during the sampling phase, and the second reference voltage during the amplification phase, and charge up to the third sampled voltage based on the second input voltage during the sampling phase and the second reference voltage during the amplification phase.

In some examples, the third switched-capacitor network includes thirteenth and fourteenth switches and a third capacitor. The thirteenth switch is configured to receive the first input voltage and a sampling clock signal, and output the first input voltage when the sampling clock signal is activated. The sampling clock signal is activated during the sampling phase. The fourteenth switch is coupled with the first output terminal of the amplifier, and is configured to receive the first output voltage and an amplification clock signal, and output the first output voltage when the amplification clock signal is activated. The amplification clock signal is activated during the amplification phase. The third capacitor is coupled with the thirteenth and fourteenth switches, and is configured to receive the first input voltage during the sampling phase, and the first output voltage during the amplification phase, and charge up to the second sampled voltage based on the first input voltage during the sampling phase and the first output voltage during the amplification phase.

In some examples, the fourth switched-capacitor network includes fifteenth and sixteenth switches and a fourth capacitor. The fifteenth switch is configured to receive the second input voltage and a sampling clock signal, and output the second input voltage when the sampling clock signal is activated. The sampling clock signal is activated during the sampling phase. The sixteenth switch is coupled with the second output terminal of the amplifier, and is configured to receive the second output voltage and an amplification clock signal, and output the second output voltage when the amplification clock signal is activated. The amplification clock signal is activated during the amplification phase. The fourth capacitor is coupled with the fifteenth and sixteenth switches, and is configured to receive the second input voltage during the sampling phase, and the second output voltage during the amplification phase, and charge up to the fourth sampled voltage based on the second input voltage during the sampling phase and the second output voltage during the amplification phase.

In some examples, a first feedback factor of the amplifier during the sampling phase is equal to a second feedback factor of the amplifier during the amplification phase. The amplifier generates the first and second output voltages based on the first feedback factor during the sampling phase, and the second feedback factor during the amplification phase.

In some examples, the first feedback factor is determined based on a resistance value of each of the first and third resistors. The second feedback factor is determined based on a capacitance value of each of the first and third switched-capacitor networks.

In some examples, a resistance value of each of the second and fourth resistors is equal to the resistance value of each of the first and third resistors, respectively. A capacitance value of each of the second and fourth switched-capacitor networks is equal to the capacitance value of each of the first and third switched-capacitor networks, respectively.

In some examples, the sampling phase is reset a reset phase of the switched-capacitor amplifier circuit.

In some examples, the sampling phase and the amplification phase are non-overlapping phases.

Various embodiments of the present disclosure disclose a switched-capacitor amplifier circuit. The switched-capacitor amplifier circuit comprises first through fourth switched-capacitor networks, an amplifier, and first through fourth reset circuits. The first through fourth switched-capacitor networks are configured to receive respective input voltages during a sampling phase of the switched-capacitor amplifier circuit, and generate corresponding sampled voltages. The amplifier is coupled with the first through fourth switched-capacitor networks during an amplification phase of the switched-capacitor amplifier circuit, and is configured to receive the corresponding sampled voltages during the amplification phase. The amplifier is further configured to receive first and second divided voltages during the sampling phase such that the amplifier is reset during the sampling phase. The amplifier is further configured to generate first and second output voltages. During the sampling phase, the first and second reset circuits are coupled with the amplifier, and are configured to receive and provide a first common-mode voltage to the amplifier. Further, during the sampling phase, the third and fourth reset circuits are coupled between respective input and output terminals of the amplifier, and are configured to receive and provide the corresponding output voltages to the respective input terminals of the amplifier. The first and second divided voltages are generated based on the first common-mode voltage and the corresponding output voltages. Each of the first through fourth reset circuits includes at least one of a resistor and a capacitor. The amplifier generates, during the sampling phase, the first and second output voltages based on a first feedback factor of the amplifier. Further, during the amplification phase, the amplifier generates the first and second output voltages based on a second feedback factor of the amplifier. The first feedback factor of the amplifier during the sampling phase is equal to the second feedback factor of the amplifier during the amplification phase.

The first through fourth reset circuits are coupled with the amplifier during the sampling phase, i.e., a reset phase, to reset the amplifier. Further, during the sampling phase, the amplifier is isolated from the first through fourth switched-capacitor networks, and the first feedback factor of the amplifier during the sampling phase is equal to the second feedback factor of the amplifier during the amplification phase. Thus, a need to design the amplifier with a significant bandwidth and a need to operate the amplifier in a unity-gain mode are eliminated. As a result, a bandwidth required and a power consumed by the switched-capacitor amplifier circuit of the present disclosure are less than bandwidth required and power consumed by conventional switched-capacitor amplifier circuits. Additionally, an equality of the first and second feedback factors ensures that modifications to an internal configuration (i.e., coupling and decoupling of internal components) of the amplifier during the reset phase are inessential. As a result, a recovery time required by the switched-capacitor amplifier circuit of the present disclosure for amplification during the amplification phase is less as compared to that required by the conventional switched-capacitor amplifier circuits. Thus, the switched-capacitor amplifier circuit of the present disclosure is suitable for high-speed applications (e.g., a high-speed analog-to-digital converter having a sampling frequency greater than 250 mega samples per second).

BRIEF DESCRIPTION OF THE DRAWINGS

The following detailed description of the preferred embodiments of the present disclosure will be better understood when read in conjunction with the appended drawings. The present disclosure is illustrated by way of example, and not limited by the accompanying figures, in which like references indicate similar elements.

DETAILED DESCRIPTION

The detailed description of the appended drawings is intended as a description of the currently preferred embodiments of the present disclosure, and is not intended to represent the only form in which the present disclosure may be practiced. It is to be understood that the same or equivalent functions may be accomplished by different embodiments that are intended to be encompassed within the spirit and scope of the present disclosure.

Figure 1:
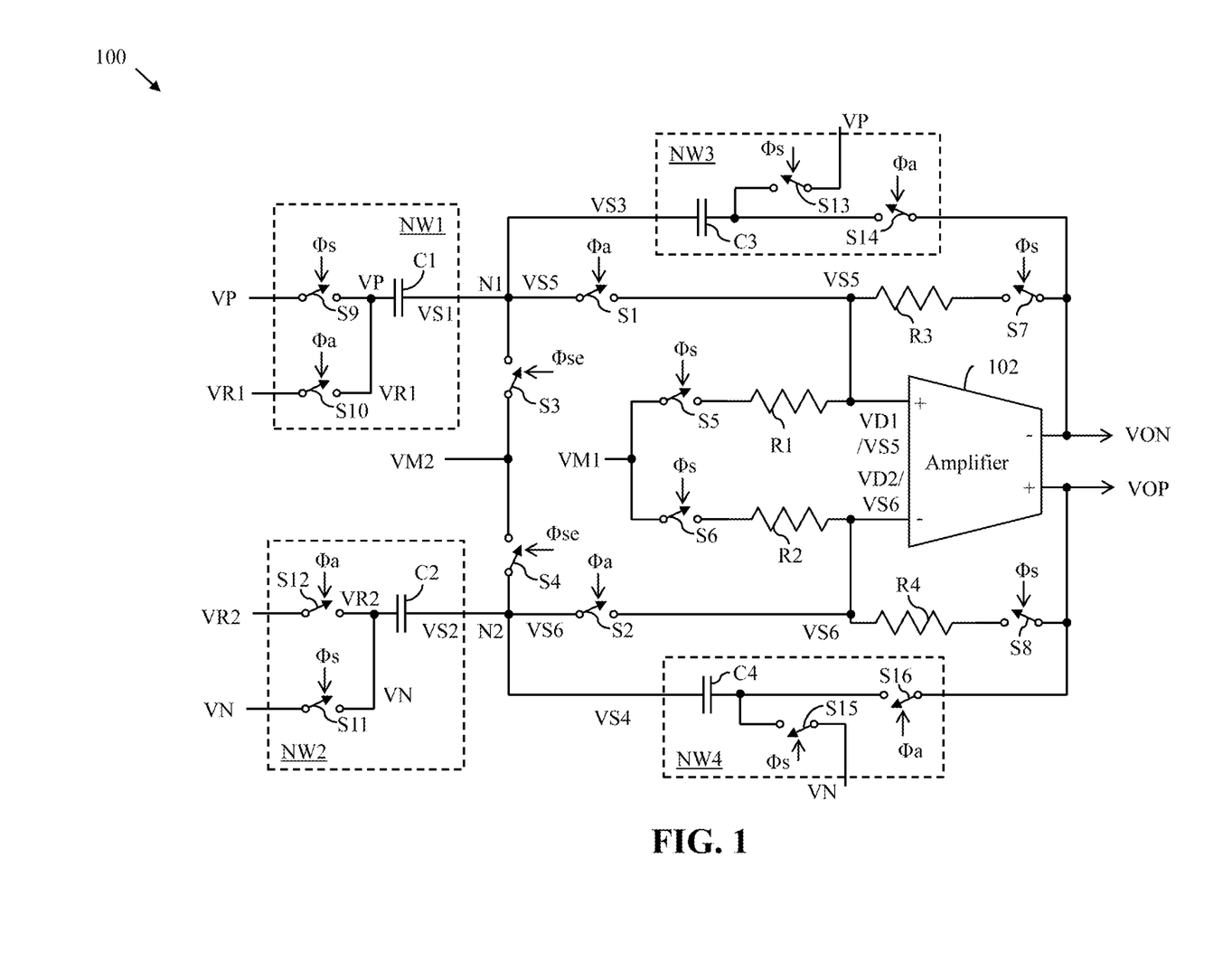
FIG. 1 is a schematic circuit diagram of a first switched-capacitor amplifier circuit in accordance with an embodiment of the present disclosure.

FIG. 1 is a schematic circuit diagram of a first switched-capacitor amplifier circuit 100 in accordance with an embodiment of the present disclosure. In one embodiment, the first switched-capacitor amplifier circuit 100 is implemented in a pipeline analog-to-digital converter (ADC) (not shown). The first switched-capacitor amplifier circuit 100 may be configured to operate as a filter, an amplifier, an integrator, a multiplying digital-to-analog converter (DAC), an adder, or the like. In one embodiment, the first switched-capacitor amplifier circuit 100 is configured to receive first and second input voltages VP and VN from a functional circuit (not shown), such as a comparator. The first and second input voltages VP and VN have equal voltages and reverse polarities. In one example, the first and second input voltages VP and VN have voltages equal to +4 volts (V) and −4 V, respectively. The first switched-capacitor amplifier circuit 100 is further configured to generate first and second output voltages VON and VOP. The first and second output voltages VON and VOP are amplified versions of the first and second input voltages VP and VN, respectively, and have equal voltages and reverse polarities.

The first switched-capacitor amplifier circuit 100 is configured to operate in two phases, i.e., a sampling phase and an amplification phase. The sampling phase is a reset phase of the first switched-capacitor amplifier circuit 100. The sampling phase and the amplification phase are non-overlapping phases. The first switched-capacitor amplifier circuit 100 includes first through fourth switched-capacitor networks NW1-NW4, an amplifier 102, first through fourth resistors R1-R4, and first through eighth switches S1-S8. During the sampling phase of the first switched-capacitor amplifier circuit 100, the first through fourth switched-capacitor networks NW1-NW4 sample input voltages, i.e., the first and second input voltages VP and VN, whereas the amplifier 102 is reset. Further, during the amplification phase of the first switched-capacitor amplifier circuit 100, the amplifier 102 amplifies the first and second input voltages VP and VN to generate the first and second output voltages VON and VOP, respectively. The first switched-capacitor amplifier circuit 100 may further include a first clock generator circuit (not shown) and a reference signal generator circuit (not shown).

The first clock generator circuit is configured to generate an input clock signal (not shown). In the presently preferred embodiment, the first clock generator circuit is further configured to generate a sampling clock signal $\Phi s$, an early-sampling clock signal $\Phi se$, and an amplification clock signal $\Phi a$. In one example, the sampling clock signal $\Phi s$, the early-sampling clock signal $\Phi se$, and the amplification clock signal $\Phi a$ are derived from the input clock signal by altering phases of the input clock signal differently for each of the sampling clock signal $\Phi s$, the early-sampling clock signal $\Phi se$, and the amplification clock signal $\Phi a$. A first half cycle of the input clock signal corresponds to the sampling phase (i.e., the reset phase) of the first switched-capacitor amplifier circuit 100, and a second half cycle of the input clock signal corresponds to the amplification phase of the first switched-capacitor amplifier circuit 100. At a start of the sampling phase, the sampling clock signal $\Phi s$ and the early-sampling clock signal $\Phi se$ are activated (i.e., generated at logic high state). The sampling clock signal $\Phi s$ remains at logic high state for the complete duration of the sampling phase, and is deactivated (i.e., generated at logic low state) when the sampling phase ends. Thus, the sampling clock signal $\Phi s$ is activated during the sampling phase. The early-sampling clock signal $\Phi se$ remains at logic high state for partial duration of the sampling phase and is deactivated (i.e., generated at logic low state) before the sampling phase ends. Further, at the start of the amplification phase, the amplification clock signal $\Phi a$ is activated (i.e., generated at logic high state). The amplification clock signal $\Phi a$ remains at logic high state for the complete duration of the amplification phase, and is deactivated (i.e., generated at logic low state) when the amplification phase ends. Thus, the amplification clock signal $\Phi a$ is activated during the amplification phase.

It will be apparent to a person skilled in the art that although in the current embodiment, the first clock generator circuit generates the sampling clock signal $\Phi s$, the early-sampling clock signal $\Phi se$, and the amplification clock signal $\Phi a$, the scope of the present disclosure is not limited to it. In various other embodiments, the first switched-capacitor amplifier circuit 100 may include second through fourth clock generator circuits (not shown) that are configured to receive the input clock signal, and generate the sampling clock signal $\Phi s$, the early-sampling clock signal $\Phi se$, and the amplification clock signal $\Phi a$, respectively, without deviating from the scope of the present disclosure.

The reference signal generator circuit is configured to generate first and second reference voltages VR1 and VR2 and first and second common-mode voltages VM1 and VM2. In one embodiment, the reference signal generator circuit corresponds to a bandgap circuit. The first and second reference voltages VR1 and VR2 have equal voltages and reverse polarities. Further, when the first through fourth switched-capacitor networks NW1-NW4 are top-plate sampling switched-capacitor networks, the first and second reference voltages VR1 and VR2 are equal to a common-mode voltage of the first and second input voltages VP and VN, respectively. Alternatively, when the first through fourth switched-capacitor networks NW1-NW4 are bottom-plate sampling switched-capacitor networks, the first and second reference voltages VR1 and VR2 are half of a supply voltage (not shown). The first and second common-mode voltages VM1 and VM2 may be equal to a ground voltage or a pre-defined voltage determined based on the supply voltage.

The first switched-capacitor network NW1 is configured to receive the first input voltage VP and the first reference voltage VR1, and generate a first sampled voltage VS1. The first input voltage VP is received during the sampling phase of the first switched-capacitor amplifier circuit 100, and the first reference voltage VR1 is received during the amplification phase of the first switched-capacitor amplifier circuit 100. Thus, during the sampling phase, the first sampled voltage VS1 is generated based on the first input voltage VP, and during the amplification phase, the first sampled voltage VS1 is generated based on the first reference voltage VR1. The first switched-capacitor network NW1 includes ninth and tenth switches S9 and S10, and a first capacitor C1.

The ninth switch S9 is configured to receive the first input voltage VP and the sampling clock signal $\Phi s$, and output the first input voltage VP when the sampling clock signal $\Phi s$ is activated. The tenth switch S10 is configured to receive the first reference voltage VR1 and the amplification clock signal $\Phi a$, and output the first reference voltage VR1 when the amplification clock signal $\Phi a$ is activated.

The first capacitor C1 is coupled with the ninth and tenth switches S9 and S10, and is configured to receive the first input voltage VP during the sampling phase, and the first reference voltage VR1 during the amplification phase. The first capacitor C1 is further configured to charge up to the first sampled voltage VS1 based on the first input voltage VP during the sampling phase and the first reference voltage VR1 during the amplification phase. In one embodiment, a capacitance value of the first switched-capacitor network NW1 is determined based on a capacitance value of the first capacitor C1. In one example, the capacitance value of the first switched-capacitor network NW1 is 'Ca'.

The second switched-capacitor network NW2 is configured to receive the second input voltage VN and the second reference voltage VR2, and generate a second sampled voltage VS2. The second input voltage VN is received during the sampling phase, and the second reference voltage VR2 is received during the amplification phase. Thus, during the sampling phase, the second sampled voltage VS2 is generated based on the second input voltage VN, and during the amplification phase, the second sampled voltage VS2 is generated based on the second reference voltage VR2. The second switched-capacitor network NW2 includes eleventh and twelfth switches S11 and S12, and a second capacitor C2.

The eleventh switch S11 is configured to receive the second input voltage VN and the sampling clock signal $\Phi s$, and output the second input voltage VN when the sampling clock signal $\Phi s$ is activated. The twelfth switch S12 is configured to receive the second reference voltage VR2 and the amplification clock signal $\Phi a$, and output the second reference voltage VR2 when the amplification clock signal $\Phi a$ is activated.

The second capacitor C2 is coupled with the eleventh and twelfth switches S11 and S12, and is configured to receive the second input voltage VN during the sampling phase, and the second reference voltage VR2 during the amplification phase. The second capacitor C2 is further configured to charge up to the second sampled voltage VS2 based on the second input voltage VN during the sampling phase and the second reference voltage VR2 during the amplification phase. In one embodiment, a capacitance value of the second switched-capacitor network NW2 is determined based on a capacitance value of the second capacitor C2 that is equal to the capacitance value of the first capacitor C1. Thus, the capacitance value of the second switched-capacitor network NW2 is equal to the capacitance value of the first switched-capacitor network NW1. In one example, the capacitance value of the second switched-capacitor network NW2 is 'Ca'.

The third switched-capacitor network NW3 is configured to receive the first input voltage VP and the first output voltage VON, and generate a third sampled voltage VS3. The first input voltage VP is received during the sampling phase, and the first output voltage VON is received during the amplification phase. Thus, during the sampling phase, the third sampled voltage VS3 is generated based on the first input voltage VP, and during the amplification phase, the third sampled voltage VS3 is generated based on the first output voltage VON. The third switched-capacitor network NW3 includes thirteenth and fourteenth switches S13 and S14, and a third capacitor C3.

The thirteenth switch S13 is configured to receive the first input voltage VP and the sampling clock signal Φs, and output the first input voltage VP when the sampling clock signal Φs is activated. The fourteenth switch S14 is coupled with the amplifier 102, and is configured to receive the first output voltage VON. The fourteenth switch S14 is further configured to receive the amplification clock signal Φa, and output the first output voltage VON when the amplification clock signal Φa is activated.

The third capacitor C3 is coupled with the thirteenth and fourteenth switches S13 and S14, and is configured to receive the first input voltage VP during the sampling phase, and the first output voltage VON during the amplification phase. The third capacitor C3 is further configured to charge up to the third sampled voltage VS3 based on the first input voltage VP during the sampling phase and the first output voltage VON during the amplification phase. In one embodiment, a capacitance value of the third switched-capacitor network NW3 is determined based on a capacitance value of the third capacitor C3. In one example, the capacitance value of the third switched-capacitor network NW3 is 'Cb'.

The fourth switched-capacitor network NW4 is configured to receive the second input voltage VN and the second output voltage VOP, and generate a fourth sampled voltage VS4. The second input voltage VN is received during the sampling phase, and the second output voltage VOP is received during the amplification phase. Thus, during the sampling phase, the fourth sampled voltage VS4 is generated based on the second input voltage VN, and during the amplification phase, the fourth sampled voltage VS4 is generated based on the second output voltage VOP. The fourth switched-capacitor network NW4 includes fifteenth and sixteenth switches S15 and S16, and a fourth capacitor C4.

The fifteenth switch S15 is configured to receive the second input voltage VN and the sampling clock signal Φs, and output the second input voltage VN when the sampling clock signal Φs is activated. The sixteenth switch S16 is coupled with the amplifier 102, and is configured to receive the second output voltage VOP. The sixteenth switch S16 is further configured to receive the amplification clock signal Φa, and output the second output voltage VOP when the amplification clock signal Φa is activated.

In one embodiment, each switch of the ninth through sixteenth switches S9-S16 is an n-channel metal oxide semiconductor transistor. In such a scenario, the activated states of the sampling clock signal Φs and the amplification clock signal Φa correspond to logic high states. In another embodiment, each switch of the ninth through sixteenth switches S9-S16 is a p-channel metal oxide semiconductor transistor. In such a scenario, the activated states of the sampling clock signal Φs and the amplification clock signal Φa correspond to logic low states.

The fourth capacitor C4 is coupled with the fifteenth and sixteenth switches S15 and S16, and is configured to receive the second input voltage VN during the sampling phase, and the second output voltage VOP during the amplification phase. The fourth capacitor C4 is further configured to charge up to the fourth sampled voltage VS4 based on the second input voltage VN during the sampling phase and the second output voltage VOP during the amplification phase. In one embodiment, a capacitance value of the fourth switched-capacitor network NW4 is determined based on a capacitance value of the fourth capacitor C4 that is equal to the capacitance value of the third capacitor C3. Thus, the capacitance value of the fourth switched-capacitor network NW4 is equal to the capacitance value of the third switched-capacitor network NW3. In one example, the capacitance value of the fourth switched-capacitor network NW4 is 'Cb'.

It will be apparent to a person skilled in the art that although in the current embodiment, each of the first through fourth switched-capacitor networks NW1-NW4 includes two switches and one capacitor, the scope of the present disclosure is not limited to it. In various other embodiments, each of the first through fourth switched-capacitor networks NW1-NW4 may include more than two switches and more than one capacitor, without deviating from the scope of the present disclosure.

The amplifier 102 is coupled with the first through fourth switched-capacitor networks NW1-NW4 during the amplification phase and with the first through fourth resistors R1-R4 during the sampling phase. The amplifier 102 has first and second input terminals that are coupled with the first and second switches S1 and S2, and are configured to receive fifth and sixth sampled voltages VS5 and VS6 during the amplification phase, respectively. The fifth sampled voltage VS5 is generated based on the first and third sampled voltages VS1 and VS3, and the sixth sampled voltage VS6 is generated based on the second and fourth sampled voltages VS2 and VS4. The first and second input terminals of the amplifier 102 are further configured to receive first and second divided voltages VD1 and VD2 during the sampling phase, respectively, such that the amplifier 102 is reset during the sampling phase. The amplifier 102 is reset to prevent an introduction of an inter-modulation distortion in the first and second output voltages VON and VOP. The first divided voltage VD1 is generated based on the first common-mode voltage VM1, the first output voltage VON, and a voltage drop across the first and third resistors R1 and R3. The second divided voltage VD2 is generated based on the first common-mode voltage VM1, the second output voltage VOP, and a voltage drop across the second and fourth resistors R2 and R4. The amplifier 102 further has first and second output terminals that are configured to generate the first and second output voltages VON and VOP, respectively. The amplifier 102 is at least one of an operational amplifier and an operational transconductance amplifier. The operational amplifier may be a single-stage or a multi-stage operational amplifier, and the operational transconductance amplifier may be a single-stage or a multi-stage operational transconductance amplifier.

The first switch S1 is coupled with the first and third switched-capacitor networks NW1 and NW3 at a first node N1, and is further coupled with the first input terminal of the amplifier 102. The first switch S1 is configured to receive the amplification clock signal Φa and the fifth sampled voltage VS5. When the amplification clock signal Φa is activated, i.e., during the amplification phase, the first switch S1 is further configured to provide the fifth sampled voltage VS5 to the first input terminal of the amplifier 102.

The second switch S2 is coupled with the second and fourth switched-capacitor networks NW2 and NW4 at a second node N2, and is further coupled with the second input terminal of the amplifier 102. The second switch S2 is configured to receive the amplification clock signal Φa and the sixth sampled voltage VS6. When the amplification clock signal (da is activated, i.e., during the amplification phase, the second switch S2 is further configured to provide the sixth sampled voltage VS6 to the second input terminal of the amplifier 102.

The third switch S3 is configured to receive the second common-mode voltage VM2 and the early-sampling clock signal Φse. The third switch S3 is coupled with the first switch S1 at the first node N1, and is further configured to provide the second common-mode voltage VM2 at the first node N1 when the early-sampling clock signal Φse is activated. Thus, the fifth sampled voltage VS5 is further generated based on the second common-mode voltage VM2.

The fourth switch S4 is configured to receive the second common-mode voltage VM2 and the early-sampling clock signal Φse. The fourth switch S4 is coupled with the second switch S2 at the second node N2, and is further configured to provide the second common-mode voltage VM2 at the second node N2 when the early-sampling clock signal Φse is activated. Thus, the sixth sampled voltage VS6 is further generated based on the second common-mode voltage VM2.

The fifth and sixth switches S5 and S6 are coupled with the first and second resistors R1 and R2, respectively, and are configured to receive the first common-mode voltage VM1. The fifth and sixth switches S5 and S6 are further configured to provide the first common-mode voltage VM1 to the first and second resistors R1 and R2, respectively, when the sampling clock signal Φs is activated.

The seventh switch S7 is coupled between the third resistor R3 and the first output terminal of the amplifier 102, and the eighth switch S8 is coupled between the fourth resistor R4 and the second output terminal of the amplifier 102. The seventh switch S7 is configured to receive the sampling clock signal Φs and the first output voltage VON, and provide the first output voltage VON to the third resistor R3 when the sampling clock signal Φs is activated, i.e., during the sampling phase. Similarly, the eighth switch S8 is configured to receive the sampling clock signal Φs and the second output voltage VOP, and provide the second output voltage VOP to the fourth resistor R4 when the sampling clock signal Φs is activated, i.e., during the sampling phase. In one embodiment, each switch of the first through eighth switches S1-S8 is an n-channel metal oxide semiconductor transistor. In such a scenario, the activated states of the sampling clock signal Φs, the early-sampling clock signal Φse, and the amplification clock signal Φa correspond to logic high states. In another embodiment, each switch of the first through eighth switches S1-S8 is a p-channel metal oxide semiconductor transistor. In such a scenario, the activated states of the sampling clock signal (Us, the early-sampling clock signal Φse and the amplification clock signal Φa correspond to logic low states.

The first and second resistors R1 and R2 are coupled with the first and second input terminals of the amplifier 102 during the sampling phase, and are configured to receive and provide the first common-mode voltage VM1 to the first and second input terminals of the amplifier 102 during the sampling phase, respectively. Further, during the sampling phase, the third resistor R3 is coupled between the first input and first output terminals of the amplifier 102, and is configured to receive and provide the first output voltage VON as a first feedback to the first input terminal of the amplifier 102. Similarly, during the sampling phase, the fourth resistor R4 is coupled between the second input and second output terminals of the amplifier 102, and is configured to receive and provide the second output voltage VOP as a second feedback to the second input terminal of the amplifier 102. In one embodiment, a resistance value of each of the second and fourth resistors R2 and R4 is equal to a resistance value of each of the first and third resistors R1 and R3, respectively. In one example, the resistance value of each of the first and second resistors R1 and R2 is 'Ra' and the resistance value of each of the third and fourth resistors R3 and R4 is 'Rb'. In one embodiment, each resister of the first through fourth resistors R1-R4 corresponds to a reset circuit (not shown).

The first and second output voltages VON and VOP are generated by the amplifier 102 based on a first feedback factor of the amplifier 102 during the sampling phase, and a second feedback factor of the amplifier 102 during the amplification phase. The first feedback factor of the amplifier 102 during the sampling phase is equal to the second feedback factor of the amplifier 102 during the amplification phase. The first feedback factor is determined based on the resistance value of each of the first and third resistors R1 and R3, and the second feedback factor is determined based on the capacitance value of each of the first and third switched-capacitor networks NW1 and NW3. Thus, when the resistance value of each of the first and third resistors R1 and R3 are 'Ra' and 'Rb', respectively, the first feedback factor is equal to 'Ra/(Ra+Rb)'. Similarly, when the capacitance value of each of the first and third switched-capacitor networks NW1 and NW3 are 'Ca' and 'Cb', respectively, the second feedback factor is equal to 'Cb/(Ca+Cb)'.

Figure 2:
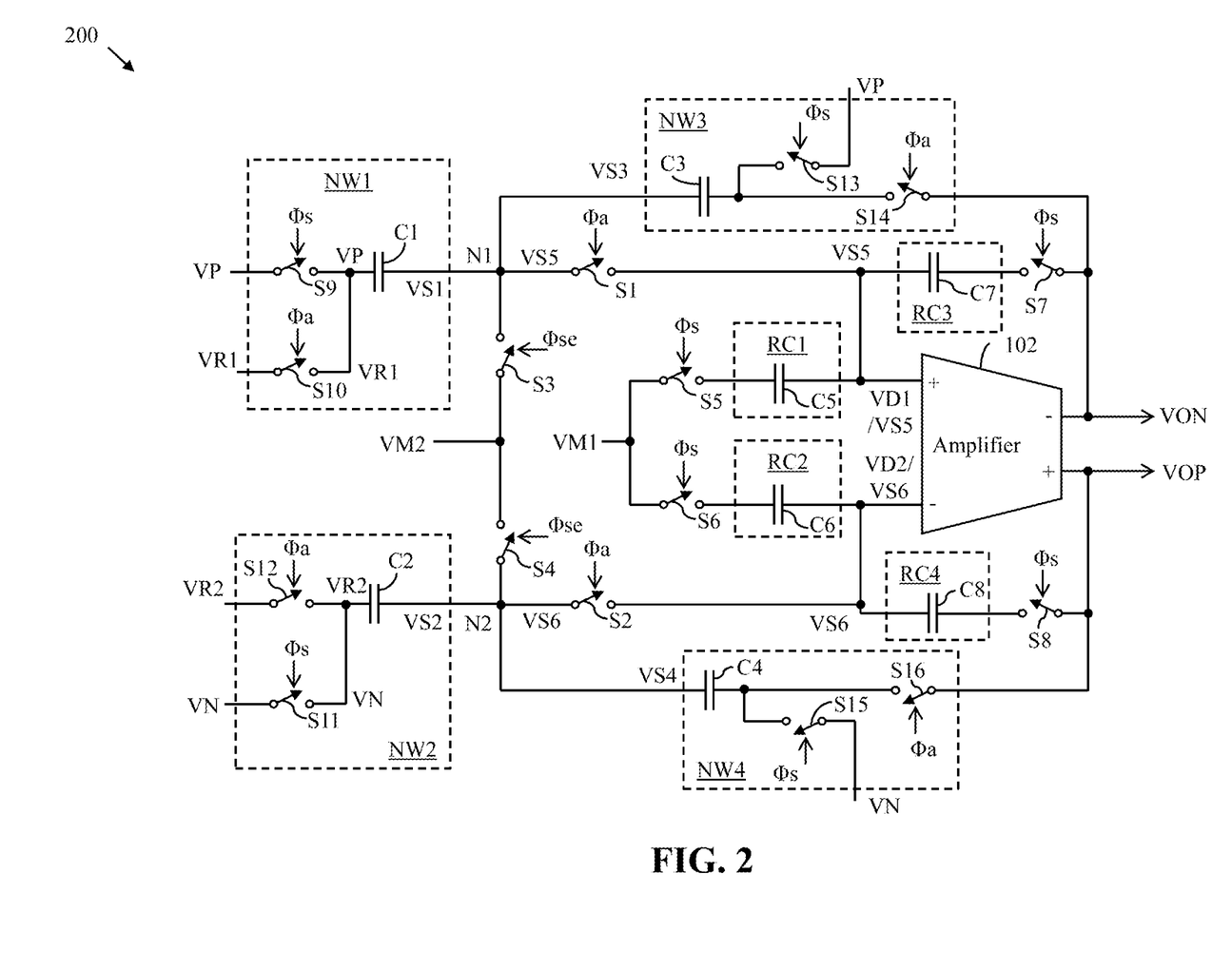
FIG. 2 is a schematic circuit diagram of a second switched-capacitor amplifier circuit in accordance with another embodiment of the present disclosure.

FIG. 2 is a schematic circuit diagram of a second switched-capacitor amplifier circuit 200 in accordance with another embodiment of the present disclosure. In one embodiment, the second switched-capacitor amplifier circuit 200 is implemented in a pipeline ADC (not shown). The second switched-capacitor amplifier circuit 200 may be configured to operate as a filter, an amplifier, an integrator, a multiplying DAC, an adder, or the like. In one embodiment, the second switched-capacitor amplifier circuit 200 is configured to receive the first and second input voltages VP and VN from the functional circuit. The second switched-capacitor amplifier circuit 200 is further configured to generate the first and second output voltages VON and VOP. The first and second output voltages VON and VOP are amplified versions of the first and second input voltages VP and VN, respectively, and have equal voltages and reverse polarities.

The second switched-capacitor amplifier circuit 200 is configured to operate in two phases, i.e., the sampling phase and the amplification phase. Further, the sampling phase is the reset phase of the second switched-capacitor amplifier circuit 200. The second switched-capacitor amplifier circuit 200 includes the first through fourth switched-capacitor networks NW1-NW4, the amplifier 102, first through fourth reset circuits RC1-RC4, and the first through eighth switches S1-S8. The second switched-capacitor amplifier circuit 200 may further include the first clock generator circuit and the reference signal generator circuit. Each switched-capacitor network (such as the first switched-capacitor network NW1) of the first through fourth switched-capacitor networks NW1-NW4 includes a plurality of switches (such as the ninth and tenth switches S9 and S10) and a capacitor (such as the first capacitor C1).

The first clock generator circuit and the reference signal generator circuit function in a similar manner as described in FIG. 1. Further, the first through fourth switched-capacitor networks NW1-NW4, the amplifier 102, and the first through eighth switches S1-S8 function in a similar manner as described in FIG. 1.

The first through fourth reset circuits RC1-RC4 include fifth through eighth capacitors C5-C8, respectively. During the sampling phase, the first and second reset circuits RC1 and RC2 are coupled with the first and second input terminals of the amplifier 102, and are configured to receive and provide the first common-mode voltage VM1 to the first and second input terminals of the amplifier 102, respectively. Further, during the sampling phase, the third reset circuit RC3 is coupled between the first input and first output terminals of the amplifier 102, and is configured to receive and provide the first output voltage VON to the first input terminal of the amplifier 102. Additionally, during the sampling phase, the fourth reset circuit RC4 is coupled between the second input and second output terminals of the amplifier 102, and is configured to receive and provide the second output voltage VOP to the second input terminal of the amplifier 102. The first divided voltage VD1 is generated based on the first common-mode voltage VM1 and the first output voltage VON, and the second divided voltage VD2 is generated based on the first common-mode voltage VM1 and the second output voltage VOP.

The fifth capacitor C5 is coupled with the fifth switch S5, and is configured to receive the first common-mode voltage VM1 during the sampling phase, and charge up to the first common-mode voltage VM1. The fifth capacitor C5 is further configured to provide the first common-mode voltage VM1 to the first input terminal of the amplifier 102. In one example, the capacitance value of the fifth capacitor C5 is 'Cc'.

The sixth capacitor C6 is coupled with the sixth switch S6, and is configured to receive the first common-mode voltage VM1 during the sampling phase, and charge up to the first common-mode voltage VM1. The sixth capacitor C6 is further configured to provide the first common-mode voltage VM1 to the second input terminal of the amplifier 102. In one embodiment, a capacitance value of the sixth capacitor C6 is equal to the capacitance value of the fifth capacitor C5. In one example, the capacitance value of the sixth capacitor C6 is 'Cc'.

The seventh capacitor C7 is coupled with the seventh switch S7, and is configured to receive the first output voltage VON during the sampling phase, and charge up to the first output voltage VON. The seventh capacitor C7 is further configured to provide the first output voltage VON to the first input terminal of the amplifier 102. In one example, the capacitance value of the seventh capacitor C7 is 'Cd'.

The eighth capacitor C8 is coupled with the eighth switch S8, and is configured to receive the second output voltage VOP during the sampling phase, and charge up to the second output voltage VOP. The eighth capacitor C8 is further configured to provide the second output voltage VOP to the second input terminal of the amplifier 102. In one embodiment, a capacitance value of the eighth capacitor C8 is equal to the capacitance value of the seventh capacitor C7. In one example, the capacitance value of the eighth capacitor C8 is 'Cd'.

The first and second output voltages VON and VOP are generated based on a third feedback factor during the sampling phase, and the second feedback factor during the amplification phase. The third feedback factor of the amplifier 102 during the sampling phase is equal to the second feedback factor of the amplifier 102 during the amplification phase. The third feedback factor is determined based on the capacitance value of each of the fifth and seventh capacitors C5 and C7. Thus, when the capacitance value of each of the fifth and seventh capacitors C5 and C7 are 'Cc' and 'Cd', respectively, the third feedback factor is equal to 'Cb/(Ca+Cb)'.

Figure 3:
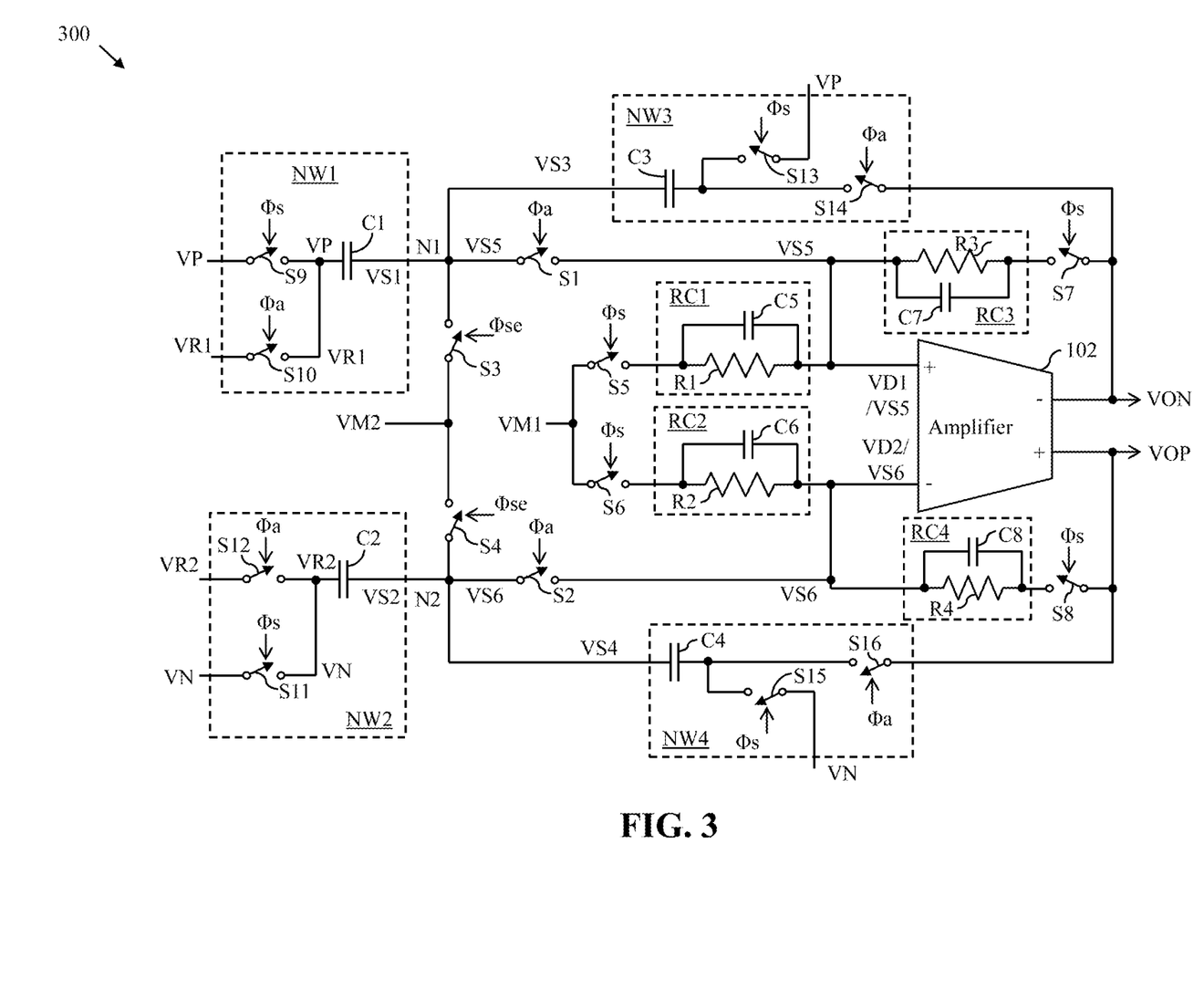
FIG. 3 is a schematic circuit diagram of a third switched-capacitor amplifier circuit in accordance with yet another embodiment of the present disclosure.

FIG. 3 is a schematic circuit diagram of the third switched-capacitor amplifier circuit 300 in accordance with yet another embodiment of the present disclosure. In one embodiment, the third switched-capacitor amplifier circuit 300 is implemented in a pipeline ADC (not shown). The third switched-capacitor amplifier circuit 300 may be configured to operate as a filter, an amplifier, an integrator, a multiplying DAC, an adder, or the like. In one embodiment, the third switched-capacitor amplifier circuit 300 is configured to receive the first and second input voltages VP and VN from the functional circuit. The third switched-capacitor amplifier circuit 300 is further configured to generate the first and second output voltages VON and VOP. The first and second output voltages VON and VOP are amplified versions of the first and second input voltages VP and VN, respectively, and have equal voltages and reverse polarities.

The third switched-capacitor amplifier circuit 300 is configured to operate in two phases, i.e., the sampling phase and the amplification phase. Further, the sampling phase is the reset phase of the third switched-capacitor amplifier circuit 300. The third switched-capacitor amplifier circuit 300 includes the first through fourth switched-capacitor networks NW1-NW4, the amplifier 102, the first through fourth reset circuits RC1-RC4, and the first through eighth switches S1-S8. The third switched-capacitor amplifier circuit 300 may further include the first clock generator circuit and the reference signal generator circuit.

The first clock generator circuit and the reference signal generator circuit function in a similar manner as described in FIG. 1. Further, the first through fourth switched-capacitor networks NW1-NW4, the amplifier 102, and the first through eighth switches S1-S8 function in a similar manner as described in FIG. 1. In the embodiment, each reset circuit of the first through fourth reset circuits RC1-RC4 includes a capacitor and a resistor coupled with the capacitor.

The first reset circuit RC1 includes the first resistor R1 and the fifth capacitor C5 coupled with the first resistor R1 in parallel, the second reset circuit RC2 includes the second resistor R2 and the sixth capacitor C6 coupled with the second resistor R2 in parallel, the third reset circuit RC3 includes the third resistor R3 and the seventh capacitor C7 coupled with the third resistor R3 in parallel, and the fourth reset circuit RC4 includes the fourth resistor R4 and the eighth capacitor C8 coupled with the fourth resistor R4 in parallel. The first through fourth resistors R1-R4 function in a similar manner as described in FIG. 1. Further, the fifth through eighth capacitors C5-C8 function in a similar manner as described in FIG. 2A. The first divided voltage VD1 is generated based on the first common-mode voltage VM1, the first output voltage VON, the resistance value of each of the first and third resistors R1 and R3, and the capacitance value of each of the fifth and seventh capacitors C5 and C7. The second divided voltage VD2 is generated based on the first common-mode voltage VM1, the second output voltage VOP, the resistance value of each of the second and fourth resistors R2 and R4, and the capacitance value of each of the sixth and eighth capacitors C6 and C8.

The amplifier 102 generates the first and second output voltages VON and VOP based on a fourth feedback factor during the sampling phase, and the second feedback factor during the amplification phase. The fourth feedback factor of the amplifier 102 during the sampling phase is equal to the second feedback factor of the amplifier 102 during the amplification phase. The fourth feedback factor is determined based on an impedance value of each of the first and third reset circuits RC1 and RC3, i.e., the resistance value of each of the first and third resistors R1 and R3, and the capacitance value of each of the fifth and seventh capacitors C5 and C7. Thus, when the impedance value of each of the first and third reset circuits RC1 and RC3 are 'Za' and 'Zb', respectively, the fourth feedback factor is equal to 'Za/(Za+Zb)'.

Figure 4:
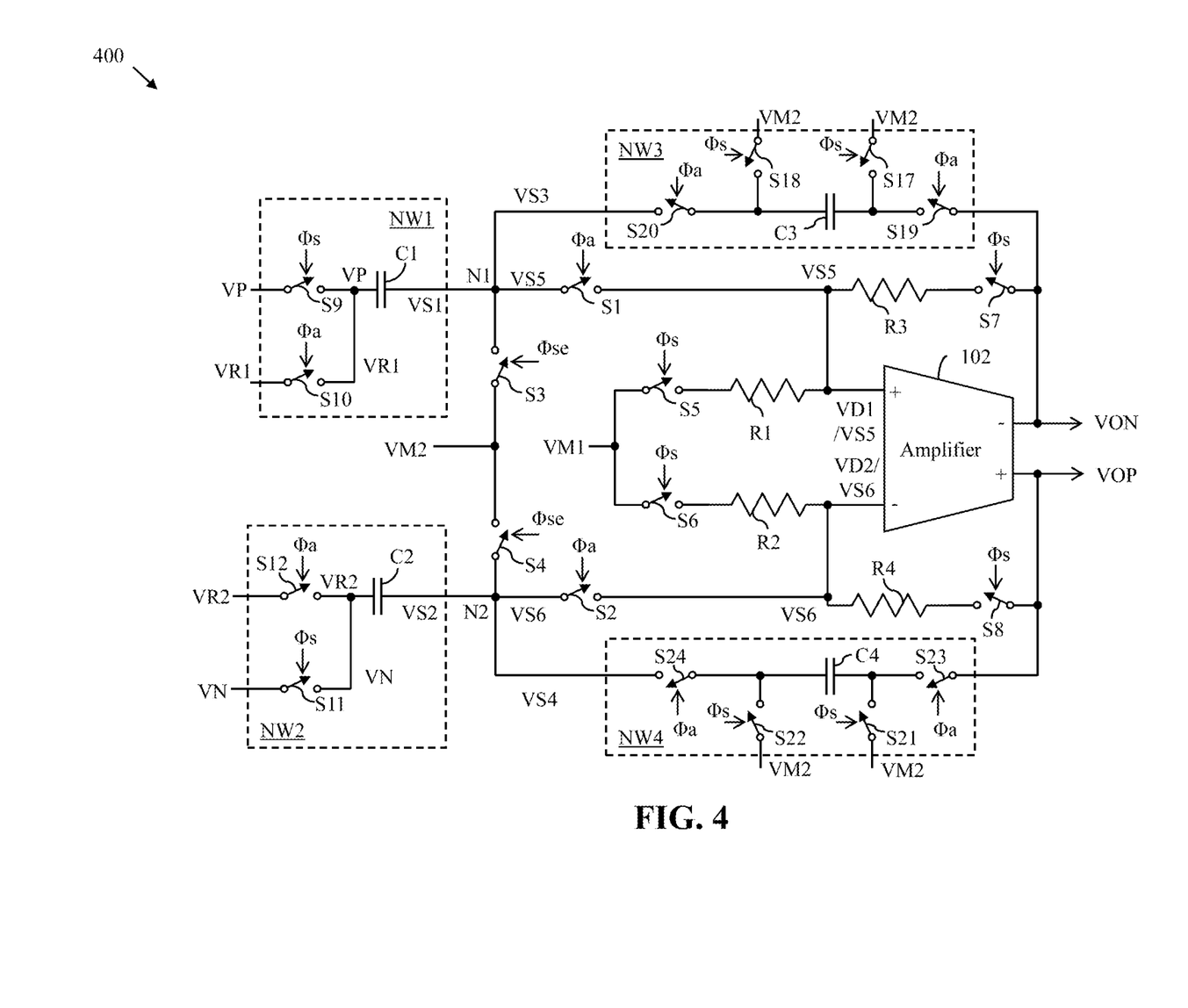
FIG. 4 is a schematic circuit diagram of a fourth switched-capacitor amplifier circuit in accordance with yet another embodiment of the present disclosure.

FIG. 4 is a schematic circuit diagram of a fourth switched-capacitor amplifier circuit 400 in accordance with yet another embodiment of the present disclosure. In one embodiment, the fourth switched-capacitor amplifier circuit 400 is implemented in a sample-and-hold circuit (not shown). The fourth switched-capacitor amplifier circuit 400 may be configured to operate as a filter, an amplifier, an integrator, a multiplying DAC, an adder, or the like. In one embodiment, the fourth switched-capacitor amplifier circuit 400 is configured to receive the first and second input voltages VP and VN from the functional circuit. The fourth switched-capacitor amplifier circuit 400 is further configured to generate the first and second output voltages VON and VOP. The first and second output voltages VON and VOP are amplified versions of the first and second input voltages VP and VN, respectively, and have equal voltages and reverse polarities.

The fourth switched-capacitor amplifier circuit 400 is configured to operate in two phases, i.e., the sampling phase and the amplification phase. Further, the sampling phase is the reset phase of the fourth switched-capacitor amplifier circuit 400. The fourth switched-capacitor amplifier circuit 400 includes the first through fourth switched-capacitor networks NW1-NW4, the amplifier 102, the first through fourth resistors R1-R4, and the first through eighth switches S1-S8. The fourth switched-capacitor amplifier circuit 400 may further include the first clock generator circuit and the reference signal generator circuit.

The first clock generator circuit and the reference signal generator circuit function in a similar manner as described in FIG. 1. Further, the first and second switched-capacitor networks NW1 and NW2, the amplifier 102, the first through fourth resistors R1-R4, and the first through eighth switches S1-S8 function in a similar manner as described in FIG. 1.

The third switched-capacitor network NW3 is configured to receive the second common-mode voltage VM2 and the first output voltage VON, and generate the third sampled voltage VS3. The second common-mode voltage VM2 is received during the sampling phase, and the first output voltage VON is received during the amplification phase. Thus, during the sampling phase, the third sampled voltage VS3 is generated based on the second common-mode voltage VM2, and during the amplification phase, the third sampled voltage VS3 is generated based on the first output voltage VON. The third switched-capacitor network NW3 includes seventeenth through twentieth switches S17 and S20, and the third capacitor C3.

The seventeenth and eighteenth switches S17 and S18 are configured to receive the second common-mode voltage VM2 and the sampling clock signal Φs, and output the second common-mode voltage VM2 when the sampling clock signal Φs is activated. The nineteenth switch S19 is coupled with the first output terminal of the amplifier 102, and is configured to receive the first output voltage VON. The nineteenth switch S19 is further configured to receive the amplification clock signal Φa, and output the first output voltage VON when the amplification clock signal Φa is activated.

The third capacitor C3 has first and second terminals that are coupled with the seventeenth and eighteenth switches S17 and S18, respectively, and are configured to receive the second common-mode voltage VM2 during the sampling phase. The first terminal of the third capacitor C3 is further coupled with the nineteenth switch S19, and is further configured to receive the first output voltage VON during the amplification phase. The third capacitor C3 is further configured to charge up to the third sampled voltage VS3 based on the second common-mode voltage VM2 during the sampling phase and the first output voltage VON during the amplification phase.

The twentieth switch S20 is coupled with the second terminal of the third capacitor C3, and is configured to receive the third sampled voltage VS3. The twentieth switch S20 is further configured to receive the amplification clock signal Φa, and output the third sampled voltage VS3 when the amplification clock signal Da is activated.

The fourth switched-capacitor network NW4 is configured to receive the second common-mode voltage VM2 and the second output voltage VOP, and generate the fourth sampled voltage VS4. The second common-mode voltage VM2 is received during the sampling phase, and the second output voltage VOP is received during the amplification phase. Thus, during the sampling phase, the fourth sampled voltage VS4 is generated based on the second common-mode voltage VM2, and during the amplification phase, the fourth sampled voltage VS4 is generated based on the second output voltage VOP. The fourth switched-capacitor network NW4 includes twenty-first through twenty-fourth switches S21 and S24, and the fourth capacitor C4.

The twenty-first and twenty second switches S21 and S22 are configured to receive the second common-mode voltage VM2 and the sampling clock signal Φs, and output the second common-mode voltage VM2 when the sampling clock signal Φs is activated. The twenty-third switch S23 is coupled with the second output terminal of the amplifier 102, and is configured to receive the second output voltage VOP. The twenty-third switch S23 is further configured to receive the amplification clock signal Ga, and output the second output voltage VOP when the amplification clock signal Φa is activated.

The fourth capacitor C4 has first and second terminals that are coupled with the twenty-first and twenty-second switches S21 and S22, respectively, and are configured to receive the second common-mode voltage VM2 during the sampling phase. The first terminal of the fourth capacitor C4 is further coupled with the twenty-third switch S23, and is further configured to receive the second output voltage VOP during the amplification phase. The fourth capacitor C4 is further configured to charge up to the fourth sampled voltage VS4 based on the second common-mode voltage VM2 during the sampling phase and the second output voltage VOP during the amplification phase.

The twenty-fourth switch S24 is coupled with the second terminal of the fourth capacitor C4, and is configured to receive the fourth sampled voltage VS4. The twenty-fourth switch S24 is further configured to receive the amplification clock signal Φa, and output the fourth sampled voltage VS4 when the amplification clock signal Φa is activated. In one embodiment, each switch of the seventeenth through twenty-fourth switches S17-S24 is an n-channel metal oxide semiconductor transistor. In such a scenario, the activated states of the sampling clock signal Φs and the amplification clock signal Φa correspond to logic high states. In another embodiment, each switch of the seventeenth through twenty-fourth switches S17-S24 is a p-channel metal oxide semiconductor transistor. In such a scenario, the activated states of the sampling clock signal Φs and the amplification clock signal Φa correspond to logic low states.

It will be apparent to a person skilled in the art that a fifth switched-capacitor amplifier circuit (not shown) may be obtained by including the first through fourth reset circuits RC1-RC4 in place of the first through fourth resistors R1-R4, in the fourth switched-capacitor amplifier circuit 400. The working of the fifth switched-capacitor amplifier circuit is similar to the second and fourth switched-capacitor amplifier circuits 200 and 400, and will be understood by a person skilled in the art.

During the sampling phase, i.e., the reset phase, at least one of the first through fourth resistors R1-R4 or the first through fourth reset circuits RC1-RC4 are coupled with the amplifier 102 to reset the amplifier 102. Further, during the sampling phase, the amplifier 102 is isolated from the first through fourth switched-capacitor networks NW1-NW4, and the first feedback factor of the amplifier 102 during the sampling phase is equal to the second or third feedback factor of the amplifier 102 during the amplification phase. Thus, a need to design the amplifier 102 with a significant bandwidth, and a need to operate the amplifier 102 in a unity-gain mode are eliminated. As a result, a bandwidth required and a power consumed by each of the first through fourth switched-capacitor amplifier circuits 100, 200, 300, and 400 are less than bandwidth required and power consumed by conventional switched-capacitor amplifier circuits. Additionally, an equality of the first feedback factor and at least one of the second or third feedback factor ensures that modifications to an internal configuration (i.e., coupling and decoupling of internal components) of the amplifier 102 are inessential during the reset phase. As a result, a recovery time required by each of the first through fourth switched-capacitor amplifier circuits 100, 200, 300, and 400 for amplification during the amplification phase is less as compared to that required by the conventional switched-capacitor amplifier circuits. Thus, the first through fourth switched-capacitor amplifier circuits 100, 200, 300, and 400 of the present disclosure are suitable for high-speed applications (e.g., a high-speed ADC having a sampling frequency greater than 250 mega samples per second).

While various embodiments of the present disclosure have been illustrated and described, it will be clear that the present disclosure is not limited to these embodiments only. Numerous modifications, changes, variations, substitutions, and equivalents will be apparent to those skilled in the art, without departing from the spirit and scope of the present disclosure, as described in the claims. Further, unless stated otherwise, terms such as "first" and "second" are used to arbitrarily distinguish between the elements such terms describe. Thus, these terms are not necessarily intended to indicate temporal or other prioritization of such elements.

The invention claimed is:

1. A switched-capacitor amplifier circuit, comprising:
first through fourth switched-capacitor networks, wherein the first and third switched-capacitor networks are configured to receive a first input voltage during a sampling phase of the switched-capacitor amplifier circuit, and generate first and second sampled voltages, respectively, and wherein the second and fourth switched-capacitor networks are configured to receive a second input voltage during the sampling phase, and generate third and fourth sampled voltages, respectively;
an amplifier that is coupled with the first through fourth switched-capacitor networks during an amplification phase of the switched-capacitor amplifier circuit, and has (i) first and second input terminals that are configured to receive fifth and sixth sampled voltages during the amplification phase, and first and second divided voltages during the sampling phase such that the amplifier is reset during the sampling phase, respectively, and (ii) first and second output terminals that are configured to generate first and second output voltages, respectively, wherein the fifth sampled voltage is generated based on the first and second sampled voltages, and the sixth sampled voltage is generated based on the third and fourth sampled voltages; and
first through fourth resistors, wherein during the sampling phase, (i) the first and second resistors are coupled with the first and second input terminals of the amplifier, and are configured to receive and provide a first common-mode voltage to the first and second input terminals of the amplifier, respectively, (ii) the third resistor is coupled between the first input and first output terminals of the amplifier, and is configured to receive and provide the first output voltage to the first input terminal of the amplifier, and (iii) the fourth resistor is coupled between the second input and second output terminals of the amplifier, and is configured to receive and provide the second output voltage to the second input terminal of the amplifier, and wherein the first divided voltage is generated based on the first common-mode voltage and the first output voltage, and the second divided voltage is generated based on the first common-mode voltage and the second output voltage.

2. The switched-capacitor amplifier circuit of claim 1, further comprising:
a first switch that is coupled with the first and third switched-capacitor networks and the first input terminal of the amplifier, and is configured to receive an amplification clock signal and the fifth sampled voltage, and provide the fifth sampled voltage to the first input terminal of the amplifier when the amplification clock signal is activated, wherein the amplification clock signal is activated during the amplification phase, and wherein the first switch is coupled with the first and third switched-capacitor networks at a first node; and
a second switch that is coupled with the second and fourth switched-capacitor networks, and the second input terminal of the amplifier, and is configured to receive the amplification clock signal and the sixth sampled voltage, and provide the sixth sampled voltage to the second input terminal of the amplifier when the amplification clock signal is activated, wherein the second switch is coupled with the second and fourth switched-capacitor networks at a second node.

3. The switched-capacitor amplifier circuit of claim 2, further comprising:

a third switch that is coupled with the first switch at the first node, and is configured to receive a second common-mode voltage and an early-sampling clock signal, and provide the second common-mode voltage at the first node when the early-sampling clock signal is activated, wherein the fifth sampled voltage is further generated based on the second common-mode voltage; and a fourth switch that is coupled with the second switch at the second node, and is configured to receive the second common-mode voltage and the early-sampling clock signal, and provide the second common-mode voltage at the second node when the early-sampling clock signal is activated, wherein the sixth sampled voltage is further generated based on the second common-mode voltage.

4. The switched-capacitor amplifier circuit of claim 1, further comprising:

fifth and sixth switches that are coupled with the first and second resistors, respectively, and are configured to receive a sampling clock signal and the first common-mode voltage, and provide the first common-mode voltage to the first and second resistors when the sampling clock signal is activated, respectively, wherein the sampling clock signal is activated during the sampling phase;

a seventh switch that is coupled between the third resistor and the first output terminal of the amplifier, and is configured to receive the sampling clock signal and the first output voltage, and provide the first output voltage to the third resistor when the sampling clock signal is activated, wherein the first divided voltage is further generated based on a voltage drop across the first and third resistors; and an eighth switch that is coupled between the fourth resistor and the second output terminal of the amplifier, and is configured to receive the sampling clock signal and the second output voltage, and provide the second output voltage to the fourth resistor when the sampling clock signal is activated, wherein the second divided voltage is further generated based on a voltage drop across the second and fourth resistors.

5. The switched-capacitor amplifier circuit of claim 1, wherein the first switched-capacitor network comprises:

a ninth switch that is configured to receive the first input voltage and a sampling clock signal, and output the first input voltage when the sampling clock signal is activated, wherein the sampling clock signal is activated during the sampling phase;

a tenth switch that is configured to receive a first reference voltage and an amplification clock signal, and output the first reference voltage when the amplification clock signal is activated, wherein the amplification clock signal is activated during the amplification phase; and a first capacitor that is coupled with the ninth and tenth switches, and is configured to receive the first input voltage during the sampling phase, and the first reference voltage during the amplification phase, and charge up to the first sampled voltage based on the first input voltage during the sampling phase and the first reference voltage during the amplification phase.

6. The switched-capacitor amplifier circuit of claim 1, wherein the second switched-capacitor network comprises:

an eleventh switch that is configured to receive the second input voltage and a sampling clock signal, and output the second input voltage when the sampling clock signal is activated, wherein the sampling clock signal is activated during the sampling phase;

a twelfth switch that is configured to receive a second reference voltage and an amplification clock signal, and output the second reference voltage when the amplification clock signal is activated, wherein the amplification clock signal is activated during the amplification phase; and a second capacitor that is coupled with the eleventh and twelfth switches, and is configured to receive the second input voltage during the sampling phase, and the second reference voltage during the amplification phase, and charge up to the third sampled voltage based on the second input voltage during the sampling phase and the second reference voltage during the amplification phase.

7. The switched-capacitor amplifier circuit of claim 1, wherein the third switched-capacitor network comprises:

a thirteenth switch that is configured to receive the first input voltage and a sampling clock signal, and output the first input voltage when the sampling clock signal is activated, wherein the sampling clock signal is activated during the sampling phase;

a fourteenth switch that is coupled with the first output terminal of the amplifier, and is configured to receive the first output voltage and an amplification clock signal, and output the first output voltage when the amplification clock signal is activated, wherein the amplification clock signal is activated during the amplification phase; and a third capacitor that is coupled with the thirteenth and fourteenth switches, and is configured to receive the first input voltage during the sampling phase, and the first output voltage during the amplification phase, and charge up to the second sampled voltage based on the first input voltage during the sampling phase and the first output voltage during the amplification phase.

8. The switched-capacitor amplifier circuit of claim 1, wherein the fourth switched-capacitor network comprises:

a fifteenth switch that is configured to receive the second input voltage and a sampling clock signal, and output the second input voltage when the sampling clock signal is activated, wherein the sampling clock signal is activated during the sampling phase;

a sixteenth switch that is coupled with the second output terminal of the amplifier, and is configured to receive the second output voltage and an amplification clock signal, and output the second output voltage when the amplification clock signal is activated, wherein the amplification clock signal is activated during the amplification phase; and a fourth capacitor that is coupled with the fifteenth and sixteenth switches, and is configured to receive the second input voltage during the sampling phase, and the second output voltage during the amplification phase, and charge up to the fourth sampled voltage based on the second input voltage during the sampling phase and the second output voltage during the amplification phase.

9. The switched-capacitor amplifier circuit of claim 1, wherein a first feedback factor of the amplifier during the sampling phase is equal to a second feedback factor of the amplifier during the amplification phase, and wherein the amplifier generates the first and second output voltages based on the first feedback factor during the sampling phase, and the second feedback factor during the amplification phase.

10. The switched-capacitor amplifier circuit of claim 9, wherein the first feedback factor is determined based on a resistance value of each of the first and third resistors, and wherein the second feedback factor is determined based on a capacitance value of each of the first and third switched-capacitor networks.

11. The switched-capacitor amplifier circuit of claim 10, wherein a resistance value of each of the second and fourth resistors is equal to the resistance value of each of the first and third resistors, respectively, and wherein a capacitance value of each of the second and fourth switched-capacitor networks is equal to the capacitance value of each of the first and third switched-capacitor networks, respectively.

12. The switched-capacitor amplifier circuit of claim 1, wherein the sampling phase is a reset phase of the switched-capacitor amplifier circuit.

13. The switched-capacitor amplifier circuit of claim 1, wherein the sampling phase and the amplification phase are non-overlapping phases.

14. A switched-capacitor amplifier circuit, comprising:
- first through fourth switched-capacitor networks, wherein the first and third switched-capacitor networks are configured to receive a first input voltage during a sampling phase of the switched-capacitor amplifier circuit, and generate first and second sampled voltages, respectively, and wherein the second and fourth switched-capacitor networks are configured to receive a second input voltage during the sampling phase, and generate third and fourth sampled voltages, respectively;
- an amplifier that is coupled with the first through fourth switched-capacitor networks during an amplification phase of the switched-capacitor amplifier circuit, and has (i) first and second input terminals that are configured to receive fifth and sixth sampled voltages during the amplification phase, and first and second divided voltages during the sampling phase such that the amplifier is reset during the sampling phase, respectively, and (ii) first and second output terminals that are configured to generate first and second output voltages, respectively, wherein the fifth sampled voltage is generated based on the first and second sampled voltages, and the sixth sampled voltage is generated based on the third and fourth sampled voltages; and
- first through fourth reset circuits, wherein during the sampling phase, (i) the first and second reset circuits are coupled with the first and second input terminals of the amplifier, and are configured to receive and provide a first common-mode voltage to the first and second input terminals of the amplifier, respectively, (ii) the third reset circuit is coupled between the first input and first output terminals of the amplifier, and is configured to receive and provide the first output voltage to the first input terminal of the amplifier, and (iii) the fourth reset circuit is coupled between the second input and second output terminals of the amplifier, and is configured to receive and provide the second output voltage to the second input terminal of the amplifier, and wherein the first divided voltage is generated based on the first common-mode voltage and the first output voltage, and the second divided voltage is generated based on the first common-mode voltage and the second output voltage.

15. The switched-capacitor amplifier circuit of claim 14, wherein each reset circuit of the first through fourth reset circuits comprises a capacitor.

16. The switched-capacitor amplifier circuit of claim 14, wherein each reset circuit of the first through fourth reset circuits comprises a capacitor and a resistor coupled with the capacitor.

17. The switched-capacitor amplifier circuit of claim 14, further comprising:
- a first switch that is coupled with the first and third switched-capacitor networks and the first input terminal of the amplifier, and is configured to receive an amplification clock signal and the fifth sampled voltage, and provide the fifth sampled voltage to the first input terminal of the amplifier when the amplification clock signal is activated, wherein the amplification clock signal is activated during the amplification phase, and wherein the first switch is coupled with the first and third switched-capacitor networks at a first node; and
- a second switch that is coupled with the second and fourth switched-capacitor networks and the second input terminal of the amplifier, and is configured to receive the amplification clock signal and the sixth sampled voltage, and provide the sixth sampled voltage to the second input terminal of the amplifier when the amplification clock signal is activated, wherein the second switch is coupled with the second and fourth switched-capacitor networks at a second node.

18. The switched-capacitor amplifier circuit of claim 17, further comprising:
- a third switch that is coupled with the first switch at the first node, and is configured to receive a second common-mode voltage and an early-sampling clock signal, and provide the second common-mode voltage at the first node when the early-sampling clock signal is activated, wherein the fifth sampled voltage is further generated based on the second common-mode voltage; and
- a fourth switch that is coupled with the second switch at the second node, and is configured to receive the second common-mode voltage and the early-sampling clock signal, and provide the second common-mode voltage at the second node when the early-sampling clock signal is activated, wherein the sixth sampled voltage is further generated based on the second common-mode voltage.

19. The switched-capacitor amplifier circuit of claim 14, further comprising:
- fifth and sixth switches that are coupled with the first and second reset circuits, respectively, and are configured to receive a sampling clock signal and the first common-mode voltage, and provide the first common-mode voltage to the first and second reset circuits when the sampling clock signal is activated, respectively, wherein the sampling clock signal is activated during the sampling phase;
- a seventh switch that is coupled between the third reset circuit and the first output terminal of the amplifier, and is configured to receive the sampling clock signal and the first output voltage, and provide the first output voltage to the third reset circuit when the sampling clock signal is activated; and
- an eighth switch that is coupled between the fourth reset circuit and the second output terminal of the amplifier, and is configured to receive the sampling clock signal and the second output voltage, and provide the second output voltage to the fourth reset circuit when the sampling clock signal is activated.

20. The switched-capacitor amplifier circuit of claim 14, wherein each switched-capacitor network of the first through fourth switched-capacitor networks comprises a plurality of switches and a capacitor.

\* \* \* \* \*